United States Patent

Duxbury

Patent Number: 5,360,949
Date of Patent: Nov. 1, 1994

[54] PRINTED CIRCUIT BOARD

[75] Inventor: Guy M. Duxbury, Nepean, Canada

[73] Assignee: Northern Telecom Limited, Montreal, Canada

[21] Appl. No.: 190,933

[22] Filed: Feb. 3, 1994

[51] Int. Cl.⁵ .............................................. H05K 1/00
[52] U.S. Cl. .................................. 174/250; 361/784; 361/792
[58] Field of Search ............... 174/250, 251, 254, 261; 361/784, 792

[56] References Cited

U.S. PATENT DOCUMENTS 4,660,125  4/1987  Purdy et al. .
4,971,848  11/1990  Ruelle et al. .
5,039,824  8/1991  Takashima et al. .
5,262,591  11/1993  Aldissi .

Primary Examiner—Leo P. Picard
Assistant Examiner—Cheryl R. Figlin
Attorney, Agent, or Firm—John E. Mowle

[57] ABSTRACT

A plurality of pairs of parallel conductive wires are supported by a flexible non-conductive sheet, equidistant from two conductive ground meshes which sandwich the wires therebetween. Each mesh forms a matrix, defining an array of intersecting conductors. The offset of the intersections from the conductive wires incrementally changes along the longitudinal axes of the pair of conductive wires. This ensures the capacitance between each conductive wire and the mesh is substantially balanced regardless of where the conducive wires run, so that cross talk between the pairs of conductive wires will remain relatively low.

8 Claims, 4 Drawing Sheets

PRINTED CIRCUIT BOARD

TECHNICAL FIELD

The present invention relates to a printed circuit board for electrically interconnecting electronic components, the printed circuit board being either flexible or non flexible.

BACKGROUND ART

Printed circuit boards (PCBs) embedding parallel conductive wires therein are widely used throughout the electronics industry particularly in applications for interconnecting electronic modules on which electronic components are mounted in high density. Ribbon cables are also widely used to connect PCBs to each other and to other equipment. In U.S. Pat. No. 4,660,125 issued to Purdy et al on Apr. 21, 1987, ribbon cables provide interconnection of a cabinet and a slidable drawer in which the PCB circuit cards of electronic components are mounted. A standard ribbon cable assembly, however, has no electric or magnetic shielding.

To provide electric and magnetic shields, flexible printed circuit boards in which parallel conductive wires are sandwiched between a mesh, have been proposed. In telecommunication applications, these conductive wires include pairs of tip and ring conductive wires for telephone lines. The conductive wires interconnect components to transmit electric signals between components. In known flexible printed circuit boards, the conductors forming the mesh generally intersect each other at right angles, and the longitudinal axes of the tip and ring conductive wires are oriented to run parallel to the intersections of the mesh. In such an arrangement, it is difficult to control placement of the parallel conductive wires relative to the intersections of the mesh. As a result, one conductive wire may be closer to the intersections of the conductors of the mesh than the other conductive wire. Should this happen, the capacitance between that one conductive wire and the mesh will be less than the capacitance between the other conductive wire and the mesh. Due to this unbalance, higher levels of cross talk are unavoidable, particularly between adjacent pairs of conductive wires transmitting signals. At audio frequencies, this was not a serious problem. However, at the very high frequencies and bit rates now being transmitted, this unbalance has become a critical problem.

SUMMARY OF THE INVENTION

It is an object of the present invention to provide an improved printed circuit board.

According to its most general aspect, the present invention provides a printed circuit board for electrically interconnecting electronic components, comprising: a non-conductive supporting member; a first conductive mesh supported by the supporting member, the conductive mesh defining an array of intersecting conductors; and at least one pair of parallel conductive wires supported by the supporting member equidistant from the conductive mesh. In the printed circuit board, the longitudinal axes of the pair of conductive wires are oriented at an angle relative to intersections of the conductors of the conductive mesh, so that the offset of the intersections from the conductive wires incrementally changes along the longitudinal axes of the pair of conductive wires so that the capacitances between the conductive wires and the conductive mesh are substantially balanced regardless of the lateral position of the wires.

In such an arrangement of the conductive wires and the conductive mesh, the capacitance between the one conductive wire and the conductive mesh will be substantially equal to the capacitance between the other conductive wire and the conductive mesh. Due to this substantial balance of the capacitances, low cross talk between adjacent pairs of parallel conductive wires transmitting signals is ensured.

In a preferred embodiment, the non-conductive supporting member is flexible and the printed circuit board includes a second conductive mesh defining an array of intersecting conductors supported by the sheet, parallel to the first conductive mesh. In this printed circuit board, the parallel conductive wires are sandwiched between and substantially equidistant from each of the conductive meshes. The longitudinal axes of the pair of conductive wires are oriented at an angle relative to intersections of the conductors of both of the conductive meshes. The conductors of the one conductive mesh are substantially parallel to those of the further conductive mesh; and the pitch of the intersections of both of the conductive meshes is substantially identical. Also, in these preferred embodiments, the angle between the longitudinal axes of the pair of conductive wires and the longitudinal axes in the direction of the intersections of the conductors of the conductive mesh is small. Such an angle provides good flexibility of the printed circuit board and balanced capacitance regardless of the lateral position of the pair of conductive wires. As well, with the two conductive meshes sandwiching the parallel conductive wires, ideal electric and magnetic shielding is provided.

BRIEF DESCRIPTION OF THE DRAWINGS

Embodiments of the present invention will now be described by way of example only with reference to the accompanying drawings in which.

BEST MODE FOR CARRYING OUT THE INVENTION

Figure 1:
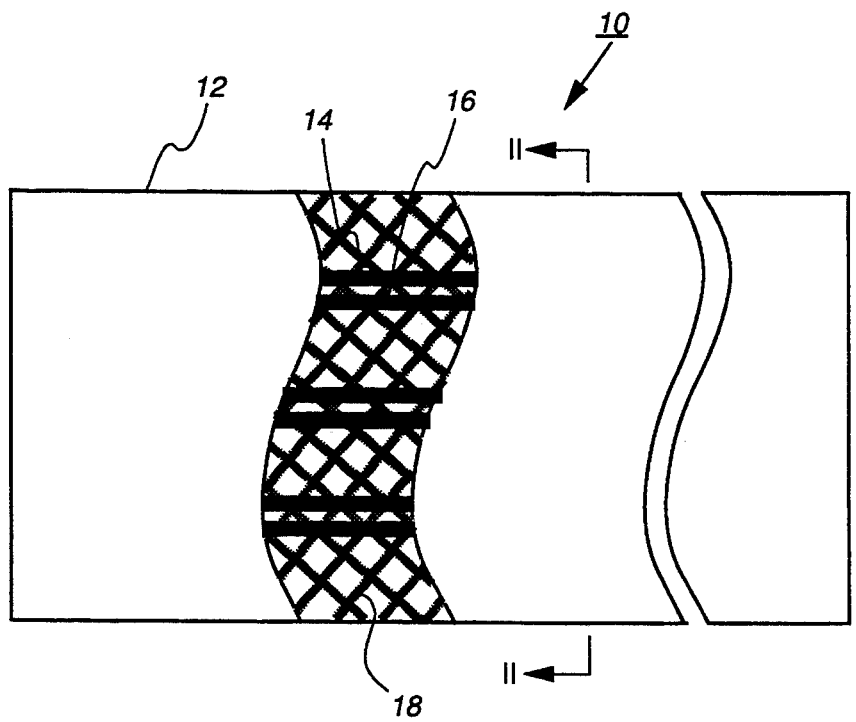
FIG. 1 is a plan and partially broken view of the printed circuit board according to the present invention.
Figure 2:
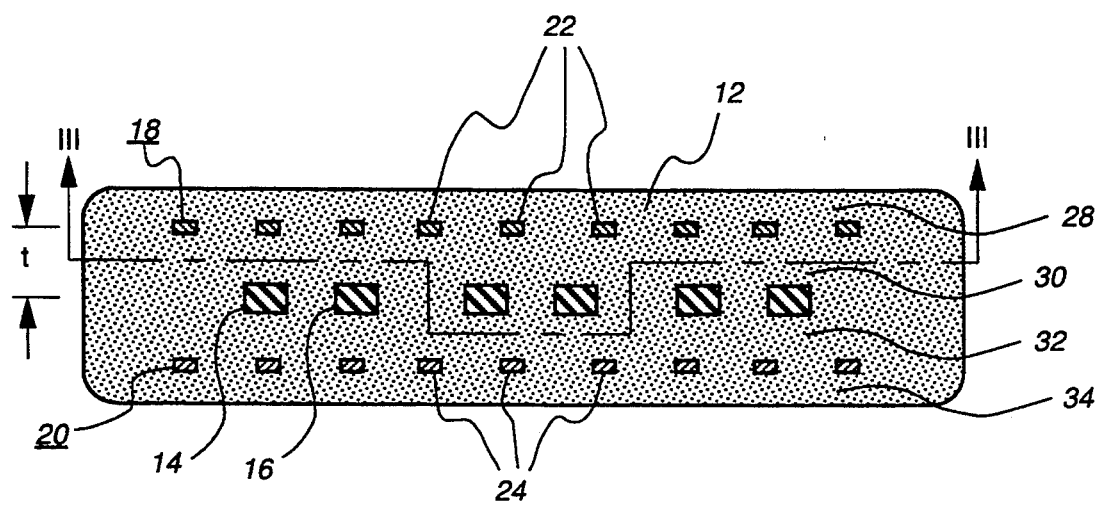
FIG. 2 is an enlarged vertically sectional view of the printed circuit board on line II—II in FIG. 1.
Figure 3:
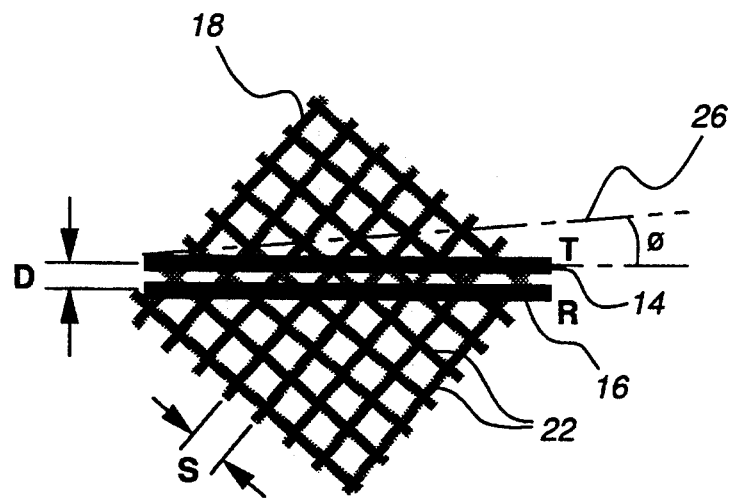
FIG. 3 is a sectional view of the printed circuit board on line III—III in FIG. 2.

Referring to FIGS. 1-3, a flexible printed circuit board 10 comprises a flexible non-conductive sheet 12, a plurality of pairs of tip (T) and ring (R) conductive wires 14 and 16 and a pair of conductive upper and lower meshes 18 and 20 which each form a ground plane. The tip and ring conductive wires 14 and 16 which run in parallel are supported by the flexible non-conductive sheet 12 and are equidistant from the upper and lower meshes 18 and 20. The upper and lower meshes 18 and 20 have a plurality of conductors 22 and 24, respectively. The conductors 22 of the upper mesh 18 and the conductors 24 of the lower mesh 20 are both embedded in the flexible non-conductive sheet 12. Each of the conductors 22 and 24 forms a matrix, defining an array of intersecting conductors. The pitch of the intersections of both conductors 22 and 24 is identical and thus, the matrix of both upper and lower meshes 18 and 20 is also identical. The conductors 22 are overlaid the conductors 24.

Typically, the conductive wires 14 and 16 are of copper. The width of the conductive wires 14 and 16 is 0.010 inches and the distance D between the two wires 14 and 16 is 0.025 inches. The distance t between each of the upper and lower meshes 18 and 20 and the conductive wires 14 and 16 is 0.014 inches. The width of the conductors 22 of the upper mesh 18 and the conductors 24 of the lower mesh 20 is 0.008 inches and the distance S between the conductors 22 or the conductors 24 is 0.040 inches. The width of the wires and the distances D, S and will vary with the application of the printed circuit board.

The conductors 22 of the upper mesh 18 (or the conductors 24 of the lower mesh 20) run substantially at right angles to each other. The longitudinal axes of the tip and ring conductive wires 14 and 16 are oriented at an offset angle $\phi$ related to a phantom line 26, which is one running through the intersections of the conductors 22 of the upper mesh 18 or the conductors 24 of the lower mesh 20, as shown in FIG. 3. The offset angle $\phi$ is preferably quite small to optimize flexibility of the printed circuit board 10. In the present example, the chosen offset angle $\phi$ is 7°. Accordingly, with orientation of the longitudinal axes of the tip and ring conductive wires 14 and 16 at the offset angle $\phi(=7°)$, the offset of the intersections from the conductive wires 14 and 16 incrementally changes along the longitudinal axes of the conductive wires. In such an arrangement of the tip and ring conductive wires 14 and 16 and the upper and lower meshes 18 and 20, both conductive wires 14 and 16 of one pair will, over an extended length, evenly cross the intersections of the conductors 22 of the upper mesh 18 and the conductors 24 of the lower mesh 20 regardless of the lateral position of the wires 14 and 16.

The flexible non-conductive sheet 12 is effectively divided by the upper mesh 18, the tip and ring conductive wires 14 and 16, and the lower mesh 20 into four layers: a first layer 28, a second layer 30, a third layer 32 and a fourth layer 34. The first and fourth layers 28 and 34 are merely insulating layers. The second layer 30 and third layer 32 are impedance control and insulating layers. Thus, the impedance of the tip and ring conductive wires 14 and 16 is determined by the material of the flexible non-conductive sheet 12, the distance between the conductive wires 14 and 16 and the distance between them and the upper and lower meshes 18 and 20.

When used for electrically interconnecting electronic components, the flexible printed circuit board 10 would typically have respective mating connectors (not shown) at both its ends, each of the mating connectors containing a plurality of connection pins. The connection pins would be electrically and physically connected to the tip and ring conductive wires 14 and 16 and the conductors 22 and 24 of the upper and lower meshes 18 and 20. With the tip and ring conductive wires 14 and 16 of the flexible printed circuit board 10, electrical signals can be transmitted between the electrical components. The conductors 22 and 24 in turn are connected to each other and further connected to a ground terminal (not shown) to provide a ground plane.

In the flexible printed circuit board, both tip and ring conductive wires 14 and 16 evenly cross the intersections of the upper and lower meshes 18 and 20 over an extended length. As a result, the overall capacitances between the tip conductive wire 14 and the upper and lower meshes 18 and 20 (i.e., ground) are the same as those between the ring conductive wire 16 and the upper and lower meshes 18 and 20. Because the capacitances are substantially balanced, cross talk is relatively low between adjacent pairs of conductive wires 14 and 16, as shown in FIG. 1. In comparison, cross talk can be up to 30 dB higher in prior art flexible printed circuit boards, in which the conductors 22 and 24 run at 45° to the longitudinal axes of the conductive wires 14 and 16 so that the offset angle $\phi$ is 0°. To optimize flexibility of the flexible printed circuit board, it is preferable that the offset angle $\phi$ be close to but not equal to 0°. It will be evident that equally effective results can be obtained with other offset angles particularly if flexibility of the printed circuit board is not a concern.

In a case where the conductors 22 of the upper mesh 18 are parallel to and off-set from the conductors 24 of the lower mesh 20, the pitch of the intersections of both conductors 22 and 24 is identical, and the offset angle $\phi$ is 7°. This arrangement provides the same advantages as those in FIGS. 1–3.

Figure 4:
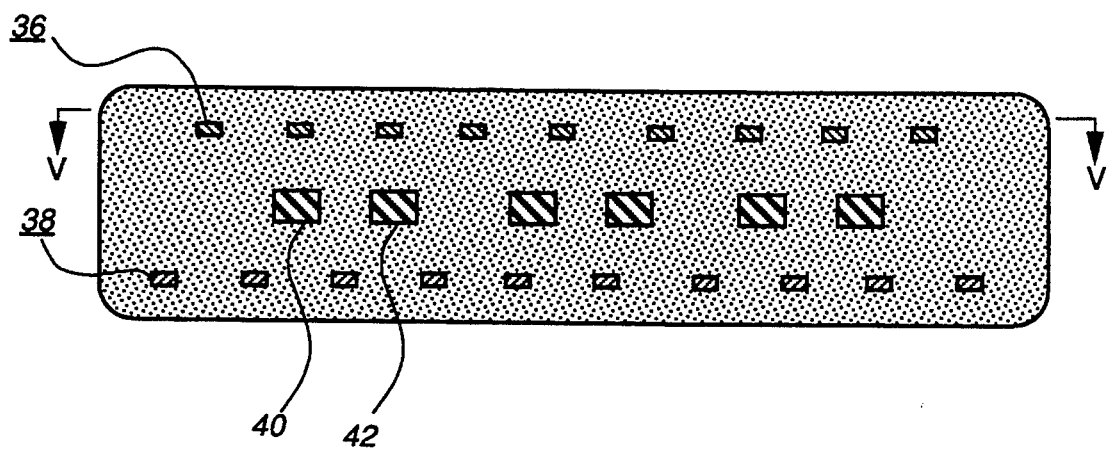
FIG. 4 is an enlarged vertically sectional view of another printed circuit board according to the present invention.
Figure 5:
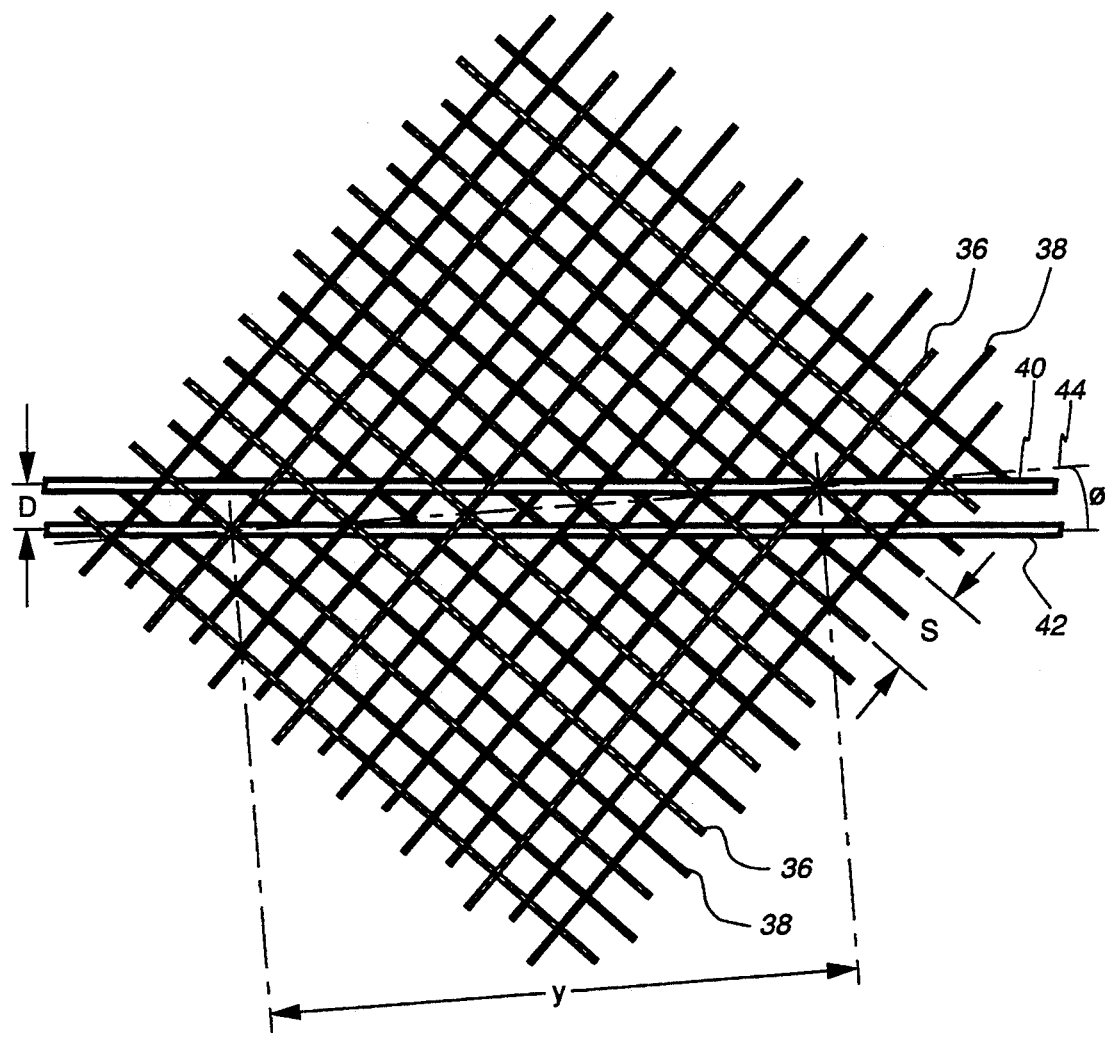
FIG. 5 is an enlarged partially excluded plan view of the printed circuit board on line V—V in FIG. 4.

FIGS. 4 and 5 show another example structure of a flexible printed circuit board. Referring to FIGS. 4 and 5, a plurality of pairs of parallel tip and ring conductive wires 40 and 42 (only one pair is shown in FIG. 5) run and are equidistant from the upper and lower mesh conductors 36 and 38. The upper mesh conductors 36 are parallel to the lower mesh conductors 38, the pitch of the intersections of both conductors 36 and 38 is identical, and the lower mesh conductors 38 are off-set from the upper mesh conductors 36. The longitudinal axes of the tip and ring conductive wires 40 and 42 are oriented at an offset angle $\phi$ related to a phantom line 44, which runs through the intersections of the upper mesh conductors 36 or the lower mesh conductors 38. Both tip and ring wires 40 and 42 cross the intersections of the mesh over a distance y. The parameters of the mesh are defined by the following equation:

$$S = D/((\sin \phi) \times n \times \sqrt{2});$$

$$y = n \times S \times \sqrt{2}$$

where, n is the number of intersections of the upper or lower mesh conductors 36 or 38 between the points where the tip conductive wire 40 and then the ring conductive wire 42 cross the phantom line 44. In one example, the distance D between the two wires 40 and 42 is 0.025 inches and the distance S between the conductors 36 or 38 is 0.0754 inches. Table I shows the relationship between the offset angle $\phi$, the number of intersection n between the two conductive wires 40 and 42 along the phantom line 44 and the distance y.

TABLE I

| n | $\phi$ | y |
|---|--------|---|
| 1 | 13.48° | 0.107 inches |
| 2 | 6.73° | 0.213 inches |
| 3 | 4.36° | 0.320 inches |
| 4 | 3.36° | 0.427 inches |

TABLE I-continued

| n | ϕ | y |
|---|---|---|
| 5 | 2.69° | 0.533 inches |
| 6 | 2.24° | 0.640 inches |
| 7 | 1.92° | 0.746 inches |
| 8 | 1.68° | 0.853 inches |
| 9 | 1.49° | 0.960 inches |
| 10 | 1.34° | 1.066 inches |

To maintain good capacitance balance, it is important that n be small. For instance, in a case where the offset angle $\phi$ is 2.69°, one conductive wire 40 crosses the intersections of the mesh conductors five intersections along the phantom line 44 after the other conductive wire 42. This maintains good capacitance balance over a short length of the conductive wires 40 and 42. For best results, the offset angle $\phi$ should be chosen so that the slope of the phantom line 44 is not a simple ratio. Thus, slopes such as 1:1, 1:2, 1:3, 2:3, 3:4, etc. should be avoided. Hence, cross talk between adjacent pairs of conductive wires 40 and 42 is effectively minimized, and the flexibility of the printed circuit board is optimized.

Figure 6:
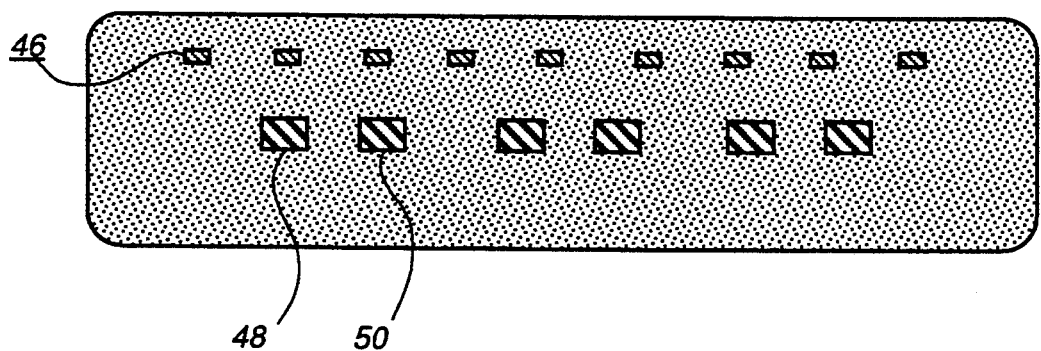
FIG. 6 is an enlarged vertically sectional view of another printed circuit board according to the present invention.

As shown in FIG. 6, only one conductive ground mesh 46 may be used in the flexible non-conductive sheet of a flexible printed circuit board. The conductor in this form of a matrix of the mesh 46 overlays a plurality of pairs of parallel tip and ring conductive wires 48 and 50.

Figure 7:
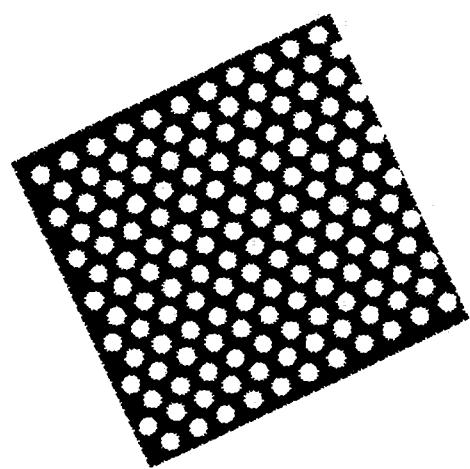
FIG. 7 illustrates another ground conductive mesh which is used for the printed circuit board according to the present invention.

The ground mesh may be replaced by a conductive sheet having a plurality of holes in the form of a matrix as shown in FIG. 7. The mesh conductive sheet also overlays parallel conductive wires.

In a typical application, where the flexible printed circuit board is installed in telecommunications equipment, it is used to interconnect mating sockets, one of which is on a board in a pull-out drawer of an electronic equipment cabinet and the other socket typically is mounted on the wall of the cabinet. Between the electronic components mounted on the circuit board and the counterparts mounted on a module connected to the electronic equipment cabinet, electrical signals (e.g., telephone and control signals and power) are transmitted through the parallel conductive wires of the flexible printed circuit board. With the two meshes sandwiching the parallel tip and ring conductive wires, ideal electric and magnetic shielding of the wires is provided. Using flexible printed circuit boards between the pull-out drawer and the electronic equipment cabinet, the pull-out drawer on which the circuit boards are mounted can be withdrawn from the electronic equipment cabinet without suspending the operation of the equipment, so as to access the circuit boards.

It will be apparent that various other mesh angles and spacings may be used to incrementally change the offset of the intersections of the mesh from the conductive wires. Also, this invention may use a rigid printed circuit board in which the non-conductive sheets supporting the meshes and tip and ring conductive wires are made of non flexible material. Furthermore, this invention may be applied to a printed circuit board of multiple structure in which two pairs of conductive wires sandwich a common ground mesh.

What is claimed is:

1. A printed circuit board for electrically interconnecting electronic components, comprising:

a non-conductive supporting member;

a conductive mesh supported by the supporting member, the conductive mesh defining an array of intersecting conductors; and at least one pair of parallel conductive wires supported by the supporting member equidistant from the conductive mesh, wherein the longitudinal axes of the pair of conductive wires are oriented at an angle relative to intersections of the conductors of the conductive mesh, so that the offset of the intersections from the conductive wires incrementally changes along the longitudinal axes of the pair of conductive wires so that the capacitances between the conductive wires and the conductive mesh are substantially balanced regardless of the lateral position of the wires.

2. The printed circuit board of claim 1, wherein the supporting member is a flexible non-conductive one.

3. The printed circuit board of claim 1 or 2, wherein the conductive mesh is a first conductive mesh, and the printed circuit board includes a second conductive mesh defining an array of intersecting conductors, the second conductive mesh being supported by the supporting member parallel to said conductive mesh, wherein:

the parallel conductive wires are sandwiched between and substantially equidistant from each of the conductive meshes; and the longitudinal axes of the pair of conductive wires are oriented at an angle relative to the intersections of the conductors of both of the conductive meshes.

4. The printed circuit board of claim 3, wherein the conductors of said conductive mesh are substantially parallel to those of the second conductive mesh.

5. The printed circuit board of claim 3, wherein:

the conductors of said conductive mesh are substantially parallel to those of the second conductive mesh; and the pitch of the intersections of both of the conductive meshes is substantially identical.

6. The printed circuit board of claim 5, wherein the conductors of said conductive mesh in plan view are off-set from the conductors of the second conductive mesh.

7. The printed circuit board of claim 1, wherein the conductive mesh and the conductive wires are defined by:

$$S = D/((\sin \phi) \times n \times \sqrt{2});$$

in which, S is the distance between the conductors of the conductive mesh;

D is the distance between the parallel conductive wires of one pair;

$\phi$ is the angle between the longitudinal axes of the pair of conductive wires and the direction of the intersections of the conductors of the conductive mesh; and n is the number of intersections of the mesh between the points where the conductive wires cross a line oriented at the angle $\phi$.

8. The printed circuit board of claim 1, 3 or 7, wherein the angle between the longitudinal axes of the pair of conductive wires and the direction of the intersections of the conductors of the conductive mesh is less than about 7°.

* * * * *